United States Patent [19]
Shinoda et al.

[11] Patent Number: 5,202,812
[45] Date of Patent: Apr. 13, 1993

[54] APPARATUS FOR DETECTING FAULTS ON POWER TRANSMISSION LINES

[75] Inventors: Katsuro Shinoda, Nagoya; Toshiyuki Kawaguchi, Inuyama; Hiroyuki Katsukawa, Niwa; Genzo Kimura, Nagoya; Naoki Tanaka, Kuwana; Hiroyuki Abe, Anjyo; Yasuhisa Sakurai, Komaki, all of Japan

[73] Assignee: NGK Insulators, Ltd., Japan

[21] Appl. No.: 407,319

[22] Filed: Sep. 14, 1989

[30] Foreign Application Priority Data

Sep. 21, 1988 [JP] Japan .................. 63-237294
Mar. 31, 1989 [JP] Japan .................. 1-83029

[51] Int. Cl.$^5$ .............................. H02H 7/26
[52] U.S. Cl. .................... 361/565; 361/93; 361/107
[58] Field of Search .......... 361/63, 65, 78, 79, 361/80, 86, 87, 62, 94, 93, 107, 31; 224/522; 324/96, 117

[56] References Cited

U.S. PATENT DOCUMENTS

| | | | |
|---|---|---|---|
| 4,363,061 | 12/1982 | Vaerewyck et al. | 361/31 |
| 4,675,773 | 6/1987 | Shirakawa et al. | 361/63 |
| 4,810,836 | 3/1989 | Shinoda et al. | 174/139 |
| 4,855,861 | 8/1989 | Bergman et al. | 361/79 X |
| 5,103,164 | 4/1992 | Kawaguchi | 324/117 |

FOREIGN PATENT DOCUMENTS

2261953 1/1979 Fed. Rep. of Germany.

Primary Examiner—Jeffrey A. Gaffin
Assistant Examiner—S. Jackson
Attorney, Agent, or Firm—Parkhurst, Wendel & Rossi

[57] ABSTRACT

In a system for transmitting an electrical power supply by means of an over-head power transmission line supported by power transmission towers, a fault such as a short-circuit fault and a ground fault is detected by providing optical current sensors having opto-magnetic elements and opto-electric field elements on respective conductors of the transmission line to detect a fault current and fault voltage on the basis of the Faraday's effect and Pockel's effect. Light beams passing through the elements are modulated by the magnetic fields induced by the currents passing through the conductors and the voltages on the conductors, and thus include information about the current and voltage. There is further provided a circuit for calculating a distance to a fault point in accordance with the detected current, voltage and a phase difference therebetween and a known impedance of the power transmission line. The thus calculated distance to the fault point is displayed on display means which is arranged at the power transmission tower or the substation.

11 Claims, 18 Drawing Sheets

FIG._1

→ Represents the Direction of Ground Current

FIG_3
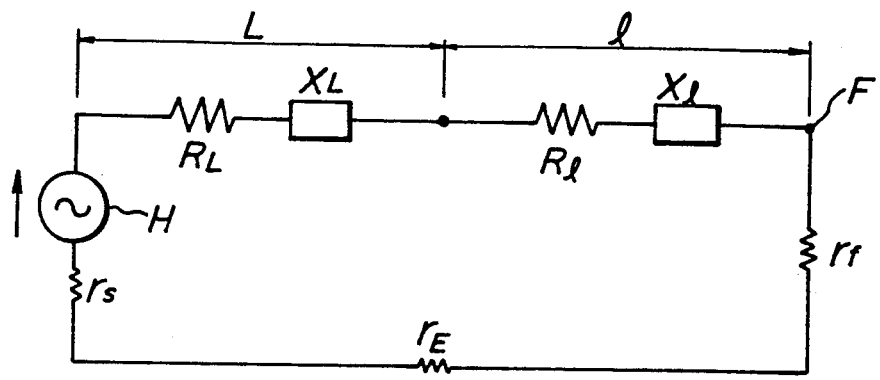
FIG_4
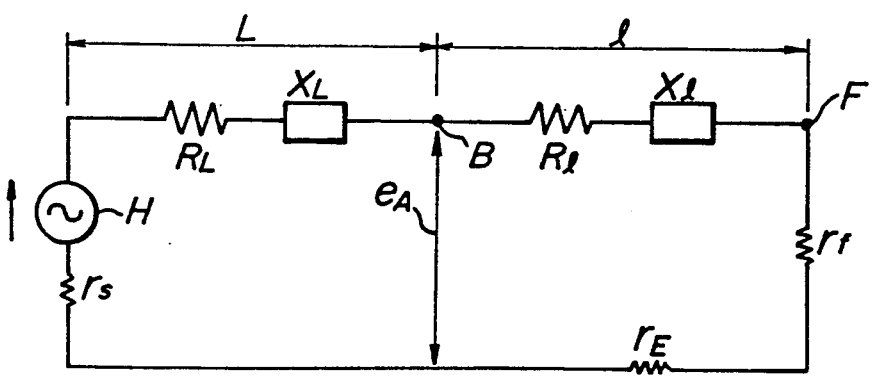

| Fault Point | Current Sensor | | Judged Line |
|---|---|---|---|
| | 3A | 3B | |
| A | X | X | PL |
| B | O | X | BL-1 |
| C | X | O | BL-2 |

| Fault Point | Current Sensor | | Judged Line |
|---|---|---|---|
| | 3A | 3B | |
| A | ⊖← | × | PL-1 |
| B | ⊖→ | × | PL-2 |
| C | ○ | ○ | BL |

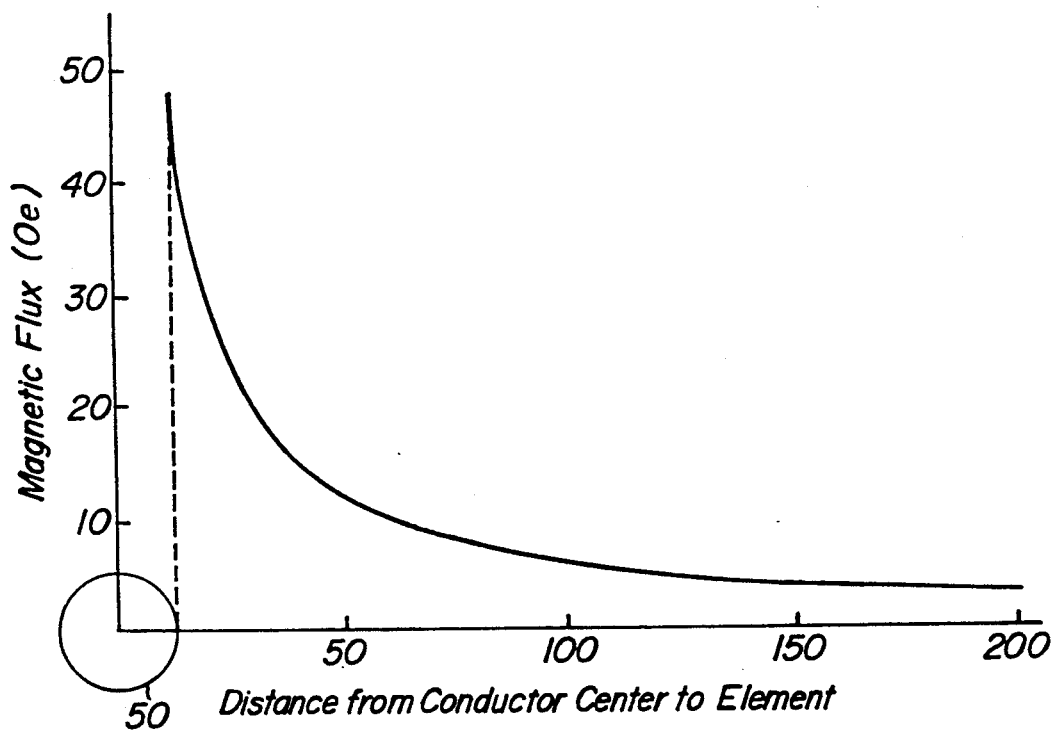
FIG_12

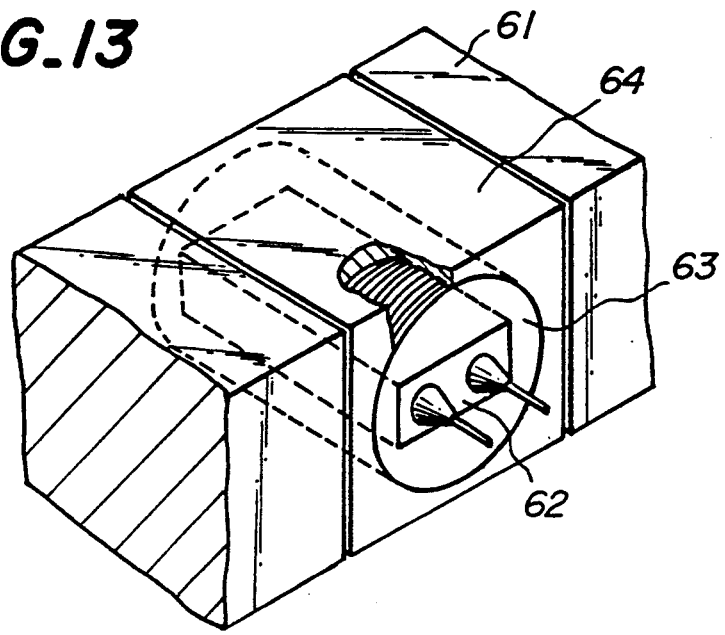
FIG._13
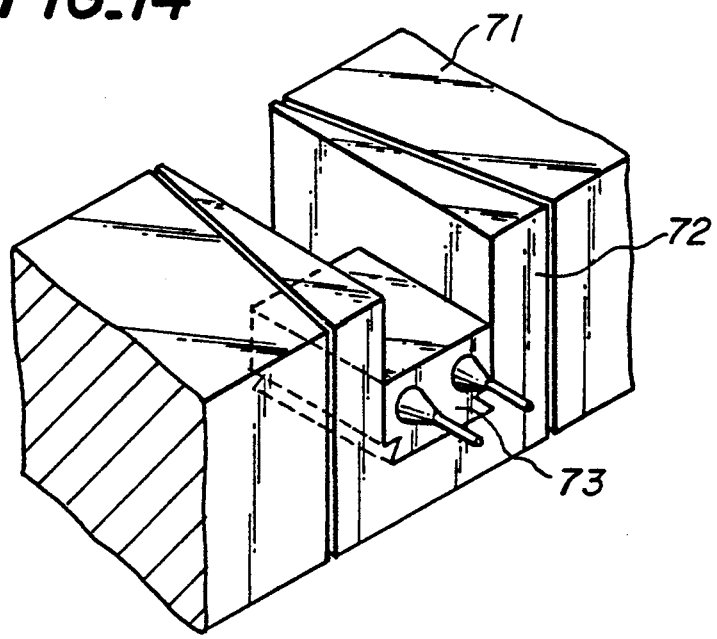
FIG._14

FIG._15
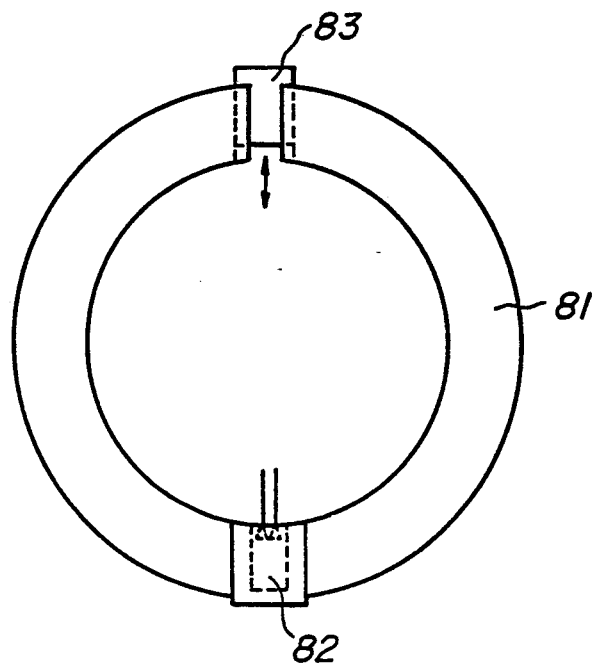
FIG._16
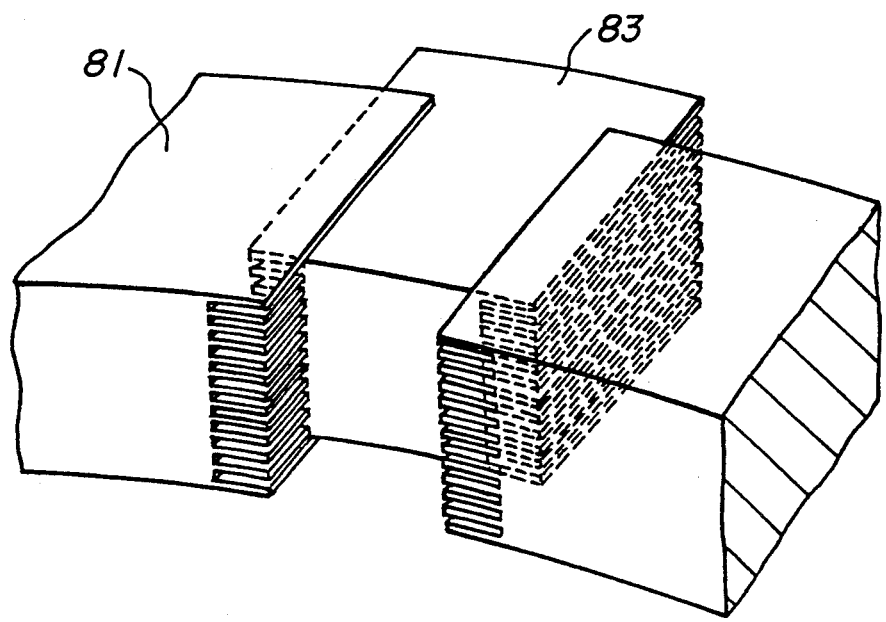

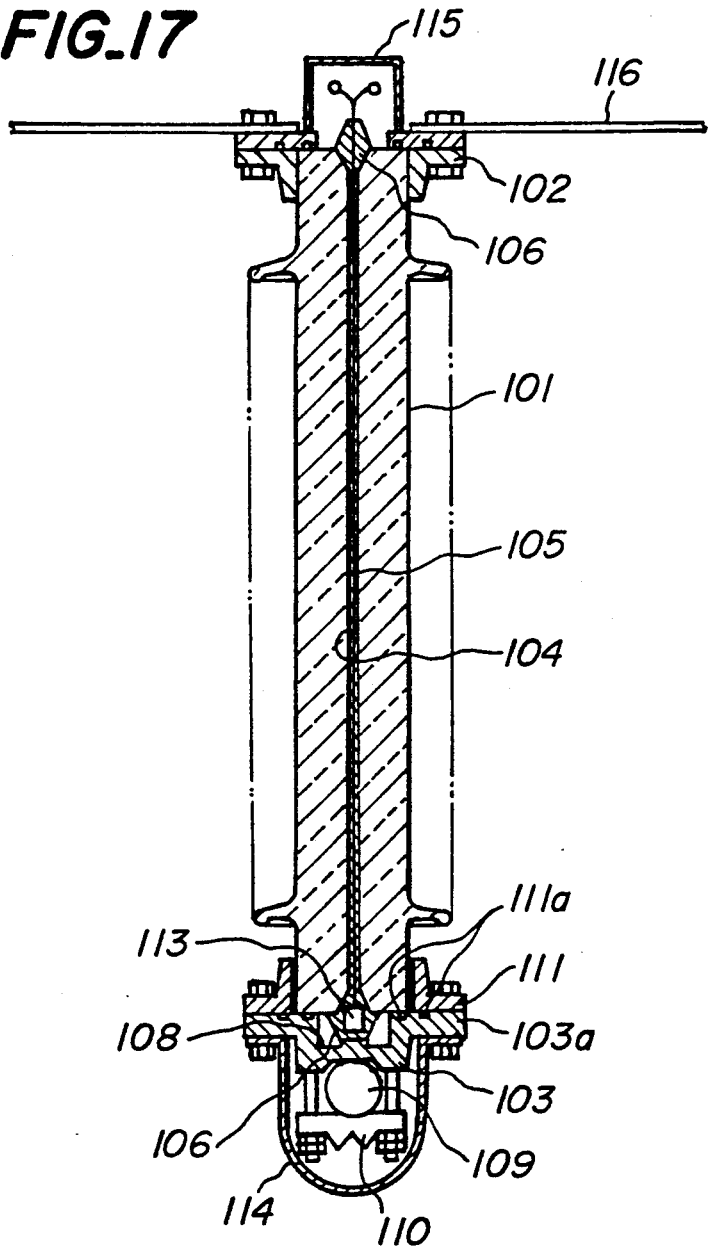

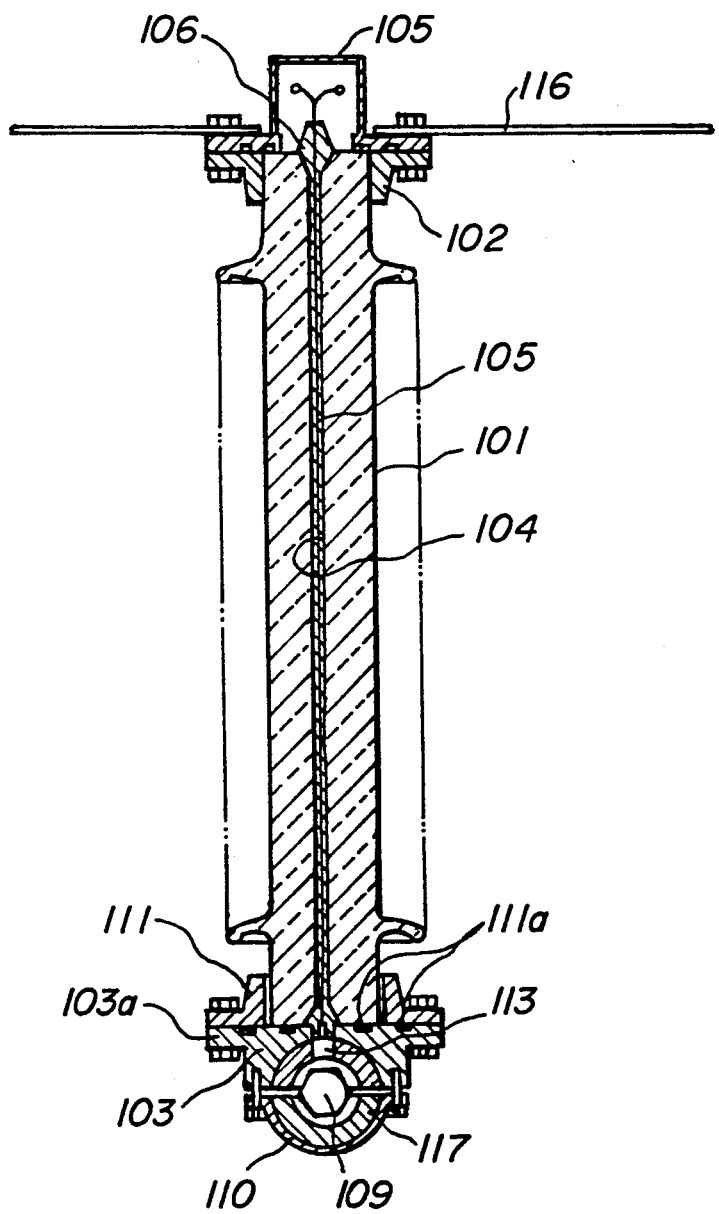

FIG_22
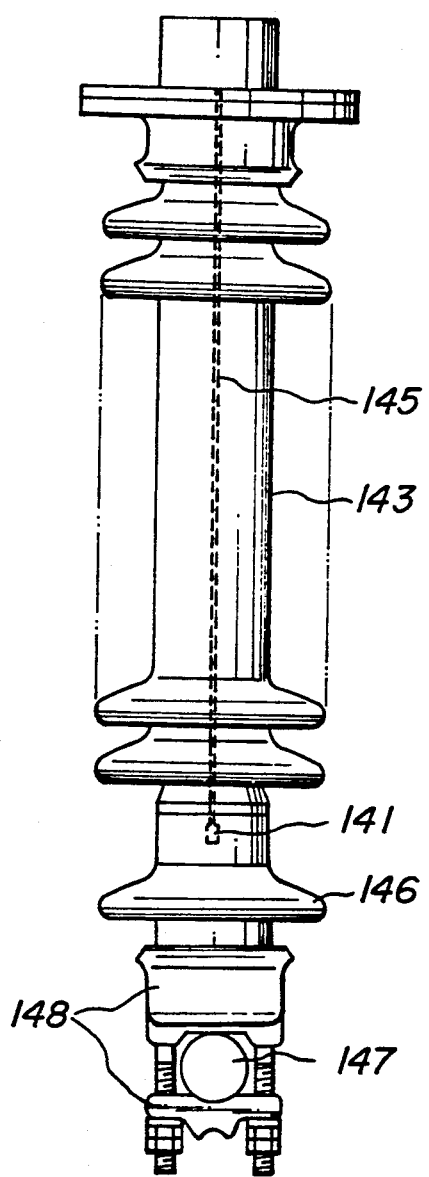
FIG_23
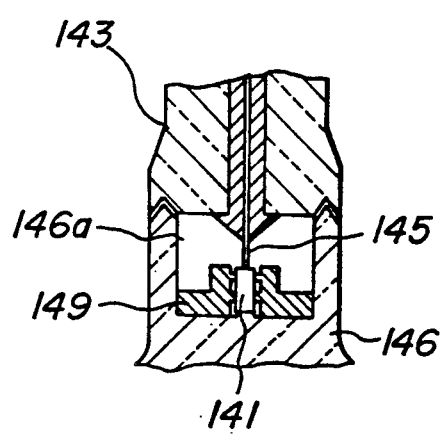

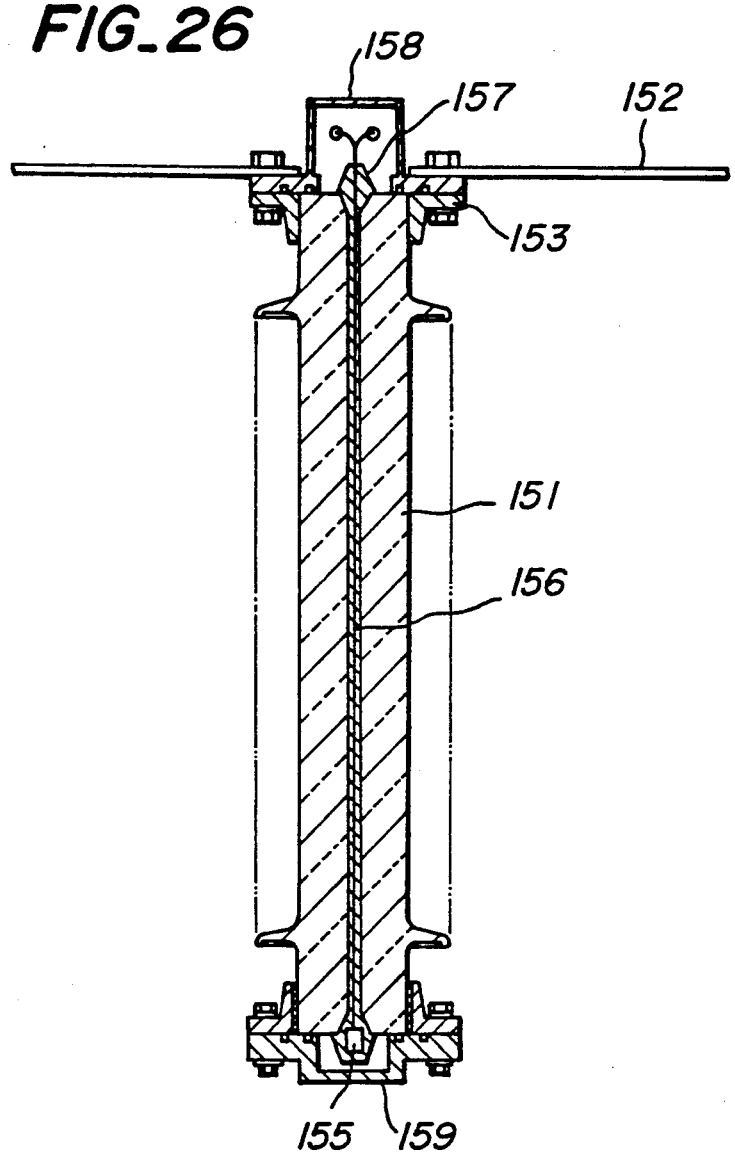
FIG_26
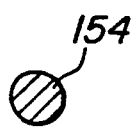

APPARATUS FOR DETECTING FAULTS ON POWER TRANSMISSION LINES

BACKGROUND OF THE INVENTION

Field of the Invention and Related Art Statement

The present invention relates to an apparatus for detecting a fault on an over-head power transmission line comprising a current sensor for detecting a current passing through the power transmission line, and a judging means for receiving a signal supplied from the current sensor and judging the occurrence of the fault.

Upon the occurrence of any accident on the over-head power transmission line, it is required to detect promptly a point at which the fault has occurred in order to shorten the power-down period as far as possible and to improve the reliability of the electric power supply. To this end, there have been developed various fault locating apparatuses for detecting a position of a fault point on the transmission line. For instance, there has been developed a known fault locator in which a fault position detecting pulse is transmitted from a watching house or station onto the over-head transmission line and the position of the fault is detected by processing a pulse reflected from the fault point. However, this apparatus has a serious demerit that the gain of the pulse is attenuated extremely, particularly when the transmission line becomes long. Moreover, when the transmission system includes branch points, it is difficult to obtain the reflection pulse exactly, so that the fault position cannot be judged correctly.

In Japanese Patent Application Publication Kokai Sho 61-170,224, there is disclosed another known apparatus in which a current transformer CT is provided on the over-head ground line to detect a current passing through the ground line upon the fault and the position of the fault is detected at the watching house. However, in this apparatus, since the fault is not directly detected by measuring the current passing through the transmission line, the fault cannot be detected positively and further, at the transmission tower at which the transmission line is branched, it is difficult to judge a section of the power transmission line in which the fault has occurred.

In Japanese Patent Application Publication No. 62-55,375, there is described another known apparatus in which a current transformer is provided on the transmission tower to detect a surge current passing through the tower upon the occurrence of the accident. Since the surge current passes only through the tower at which the fault occurs, it is necessary to arrange current transformers on all towers, and thus the cost of the whole system is liable to be increased. Moreover, this known apparatus has a drawback that the current transformer cannot be easily provided on the tower depending upon the kinds of the towers.

SUMMARY OF THE INVENTION

The present invention has for its object to provide a novel and useful apparatus for detecting a fault position on the over-head power transmission line, in which the fault point can be located accurately and positively even if the transmission system includes long distance lines and branches.

It is another object of the invention to provide an apparatus for detecting a fault point on the power transmission system, in which the fault point can be detected in a reliable manner without providing current transformers on all transmission towers.

According to the invention, an apparatus for detecting a fault on an over-head power transmission line comprises:

optical current sensing means including at least one optical current sensor which comprises an opto-magnetic element for detecting a current passing through a power transmission conductor to generate an optical signal and an insulator for securing the opto-magnetic element to a power transmission tower such that the opto-magnetic element is positioned to sense the magnetic field induced by the current passing through the power transmission conductor supported by the power transmission tower;

optical signal transmitting means for transmitting the optical signal generated by the opto-magnetic element in such a manner that the optical signal is transmitted in an electrically insulated manner from conductive portions of the power transmission line and tower; and judging means for receiving the optical signal transmitted through the optical signal transmitting means and judging the occurrence of a fault on the power transmission line in accordance with the optical signal.

BRIEF DESCRIPTION OF THE DRAWINGS

FIGS. 3 and 4 are equivalent circuits for explaining the principle of calculating the distance to the fault point;

FIG. 12 is a graph representing the variation of the magnetic field induced by the current passing through the conductor with respect to the distance between the sensor and the conductor;

FIG. 13 is a perspective view illustrating a first embodiment of the optical current sensor in which the detection sensitivity can be adjusted;

FIG. 14 is a perspective view showing a second embodiment of the optical current sensor having the variable sensitivity;

FIGS. 15 and 16 are plan and perspective views, respectively showing a third embodiment of the optical current sensor having the variable sensitivity;

FIG. 17 is a cross sectional view depicting another embodiment of the optical current sensor;

FIG. 18 is cross sectional view showing a modification of the optical current sensor illustrated in FIG. 17;

FIG. 22 is a side view of still another embodiment of the optical current sensor according to the invention;

FIG. 23 is a cross sectional view depicting a part of the sensor illustrated in FIG. 22;

FIG. 26 is a cross sectional view illustrating still another embodiment of the optical current sensor according to the invention.

DESCRIPTION OF THE PREFERRED EMBODIMENTS

Figure 1:
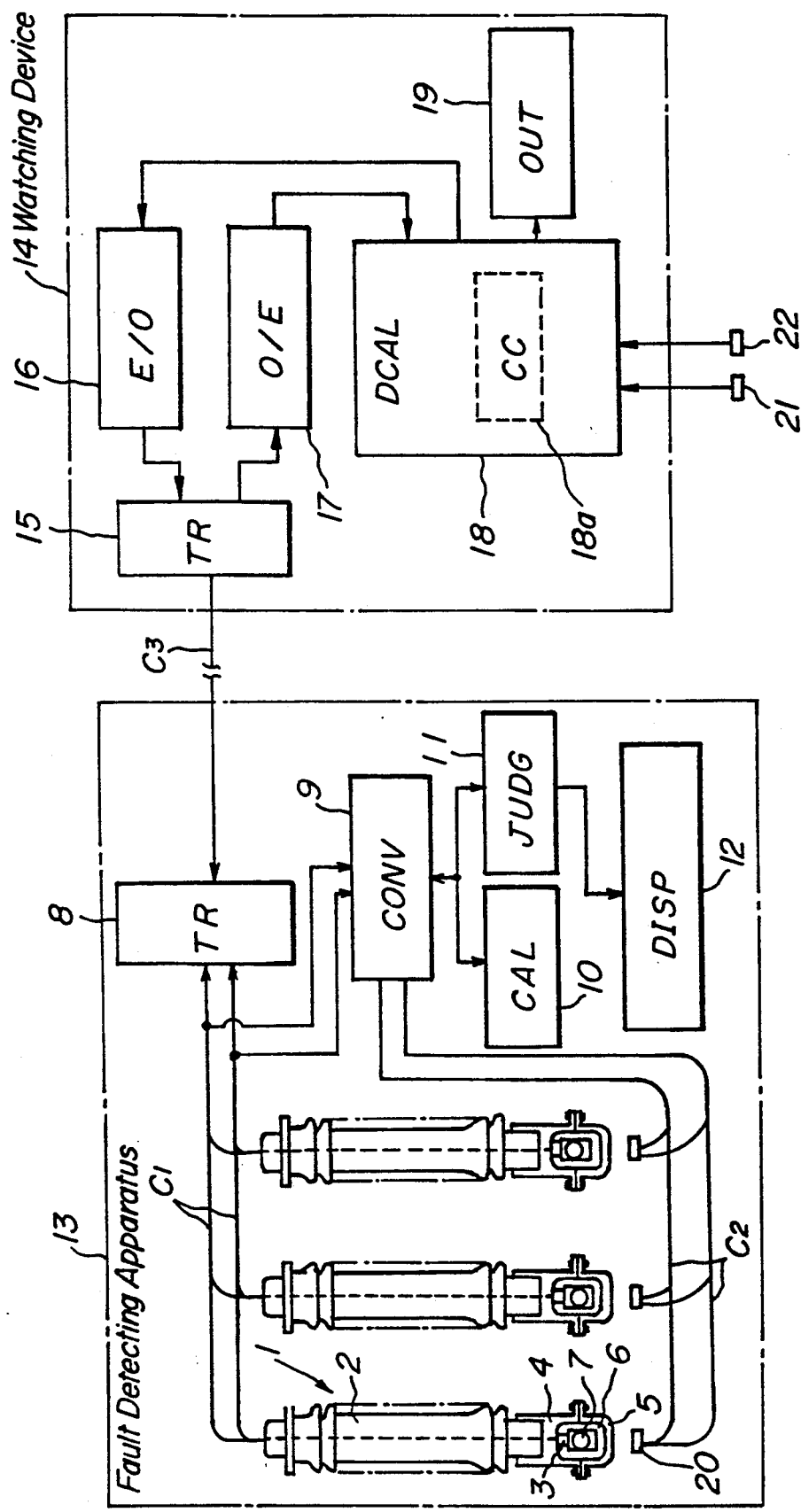
FIG. 1 is a block diagram showing the whole construction the fault detecting apparatus according to the invention.
Figure 2:
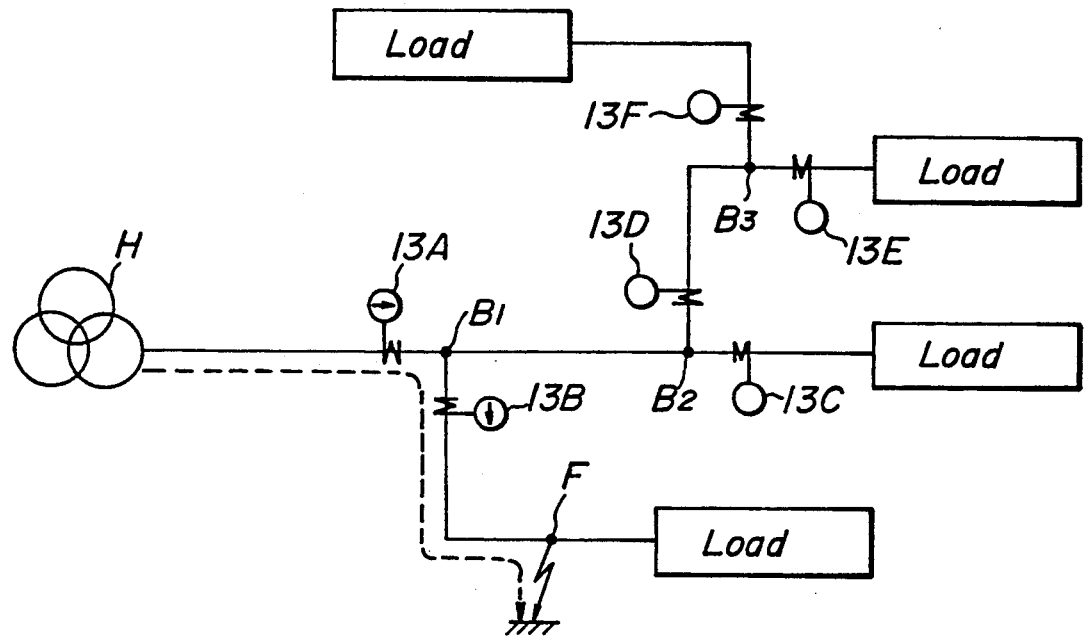
FIG. 2 is a block diagram illustrating the fault point judging operation in the apparatus according to the invention.

FIGS. 1 and 2 show an embodiment of the apparatus for detecting a fault point on the power transmission system according to the present invention. A reference numeral 13 denotes generally a fault detecting apparatus which is arranged on a power transmission tower. The fault detecting apparatus comprises optical current sensors 1, each of which includes an insulator having a optical fiber C1 installed therein and an opto-magnetic element 3 optically coupled with the optical fiber. It should be noted that a single transmission circuit includes three transmission conductors through which current having different phases flow, and thus, there are arranged three optical current sensors 1. In the insulator 2, there is formed a central hole and the optical fiber C1 is inserted into the central hole. At a lower end of the insulator 2, there is arranged a magnetic core 6 by means of a fixing member 4 and fitting member 5, which serve to clamp a power transmission conductor 7 at the lower end of insulator 2. The opto-magnetic element 3 is arranged such that the magnetic field induced in the magnetic core 6 by the electric current passing through the conductor 7 is detected by the element. That is to say, the polarization direction of the light transmitted through the element 3 via the optical fiber C1 is rotated or modulated by the magnetic field applied to the element. To this end, in the present embodiment, the opto-magnetic element 3 is formed by Faraday's element such as YIG and BSO. In this manner, information about the currents passing through the conductors 7 can be derived along the optical fiber C1.

In the present embodiment, near the conductors 7 there are further arranged opto-electric field elements 20 which detect the voltage applied to the conductors 7. That is to say, these opto-electric field elements 20 are formed by Pockel's elements such as BSO and LN and are coupled with an optical fiber C2 such that the polarizing direction of the light transmitted through the optical fiber is rotated or modulated by the electric field applied to the elements. In this manner, information about the voltage applied to the conductors 7 can be derived via the optical fiber C2. It should be noted that instead of arranging separate elements for detecting the current and voltage on the conductor, it is also possible to arrange a single element such as BSO which has both the Faraday's effect and Pockel's effect.

The optical fiber C1 derived from the insulator 2 is coupled with a transmission and reception circuit (TR) 8 which amplifies and transmits the optical signal representing the current detected by the element 3, and the absolute values of the current and voltage and the phase difference therebetween supplied from a calculation circuit (CAL) 10 via an optical-electrical converter (CONV) 9. The optical-electrical converter 9 serves to convert the light signal into the electric signal and vice versa. The optical fibers C1 and C2 are coupled with the converter 9.

The calculation circuit 10 receives the electric signals supplied from the converter 9 and calculates the absolute values of the current and voltage and the phase difference therebetween in accordance with the current and voltage detected by the opto-magnetic elements 3 and opto-electric field elements 20. The information signal including these absolute values and phase difference is supplied via the converter 9 and transmission and reception circuit 8 to a watching device 14 provide in a sub-station H.

To the calculation circuit 10 is connected a judging circuit (JUDG) 11 to which is further connected a display device (DISP) 12. When an accident occurs on the power transmission line, the judging circuit 11 judges the direction of the fault current and the thus judged direction of the fault current is displayed on the display device 12. The judged direction of the fault current is also transmitted to the watching device 14 via the converter 9 and the transmission and reception circuit 8. It should be noted that the direction of the fault current may be judged on the basis of the phase of the current with respect to the voltage.

The above explained fault detection apparatus 13 according to the invention may be advantageously arranged at a branch tower at which the power transmission line is divided into a plurality of branch lines. The transmission and reception circuit 8 is connected to the watching device 14 by means of an overhead optical fiber cable C3.

Now the construction of the watching device 14 provided in the sub-station H will be explained.

The watching device 14 comprises a transmission and reception circuit (TR) 15 to which the optical fiber cable C3 is connected. To the transmission and reception circuit 15 are connected electrical-optical conversion circuit (E/O) 16 for converting the electrical signal into the light signal and optical-electrical conversion circuit (O/E) 17 for converting the light signal into the electrical signal. The watching device 14 further comprises a distance calculating circuit (DCAL) 18 for calculating the distance from the watching device 14 to a point on the power transmission line at which the fault has occurred. To the distance calculated circuit 18 are connected two sensors 21 and 22 for detecting the fault current and fault voltage at the sub-station H. Similar to the judging circuit 11 provided in the fault detecting apparatus 13, the calculating circuit 18 can judge the direction of the fault current. Therefore, when the fault detecting apparatus 13 provided on the power transmission tower detects the occurrence of the fault, the sensors 21 and 22 detect the fault current and fault voltage at the sub-station H and the absolute values of the current and voltage and the phase difference therebetween are calculated. Then, the calculating circuit 18 calculates a distance from the sub-station H to the fault point F. In the calculating circuit 18, there is arranged a correction circuit (CC) 18a which compares the fault current (short-circuited current) calculated by the calculating circuit 10 in the fault detecting apparatus 13 and the fault current (short-circuited current) calculated by the distance calculating circuit 18 in the watching device 14 with each other and calculates the distance by correcting the normal current component passing through a normal transmission section in which a fault has not occurred. That is to say, in case of the short-circuited fault, the fault current detected at the sub-station H includes the normal current components, so that the correction circuit 18a operates to compensate the normal current components. To the calculating circuit 18 is connected an output device (OUT) 19 such as printer and monitor.

FIG. 3 is an equivalent circuit of the power transmission system in case of occurring the ground fault in which a transmission conductor 7 is connected to the ground or the earth. In this case, the calculating circuit 18 in the watching device 14 calculates the distance from the branch point B to the fault point F in the following manner.

$R_L$: resistance from the sub-station H to the branch B
$X_L$: reactance from the sub-station H to the branch B
$R_f$: resistance from the branch B to the fault point F
$X_f$: reactance from the branch B to the fault point F
L: distance from the sub-station H to the branch B
l: distance from the branch B to the fault point F
$r_f$: surge resistance at the fault point
$r_E$: earth resistance of fault current feedback loop
$r_s$: earth resistance Of the Sub-station H
R: resistance of the conductor per unit length
X: reactance of the conductor per unit length
r: resistance of the current feedback loop per unit length
e: voltage at the sub-station H
$|E|$: absolute value of the sub-station voltage
$=|I_f|$: absolute value of the fault current Then, the fault current $i_f$ may be expressed as follows.

$$i_f = e/\{R_L + R_l + r_f + r_E + r_s + j(X_L + X_l)\} \quad (1)$$

From the above mentioned equation (1), the following equation (2) may be derived.

$$|E|^2/|I_f|^2 = \{R(L+l) + r_E + r_f + r_s\}^2 + X^2(L+l)^2 \quad (2)$$

On the other hand, the phase difference between the fault current and the fault voltage may be given by the following equation (3).

$$\tan \phi = X(L+l)/\{R(L+l) + r_E + r_f + r_s\} \quad (3)$$

Then, the following equation (4) may be obtained.

$$r_E + r_f + r_s = \{X(L+l)/\tan \phi\} - R(L+l) \quad (4)$$

The distance l from the branch B to the fault point F may then be derived from the above equations (2) and (4) in following manner.

$$l = -L + (|E|/|I_f|X)\{\sqrt{\tan \phi/(1 + \tan \phi)}\} \quad (5)$$

Among the above mentioned parameters, the absolute value of the sub-station voltage $|E|$, the absolute value of the fault current $|I_f|$ and the phase difference $\tan \phi$ may be derived from the detection signals supplied from the fault detecting apparatus 13. The impedance X has been known for respective sections of the power transmission system and thus may be regarded as the constant. Moreover, the distance from the sub-station H to the branch B has been also known and may be treated as the constant.

Now the operation of the fault point detecting system according to the invention will be explained by taking an example in which the ground fault has occurred on the power transmission line.

As illustrated in FIG. 2, when the ground fault has occurred at a point F on the power transmission line, the ground fault current is detected by the opto-magnetic elements 3 of the fault detecting apparatuses 13A and 13B provided at a first branch tower $B_1$. Then, the fault detection signal is supplied to the watching device 14 provided at the sub-station H by means of the transmission and reception circuit 8 and optical fiber cable C3. The detected light signal is also supplied to the converter 9 via the optical fiber C1 and is converted into the electric signal. At the same time, the opto electric field elements 20 detect the voltage, and the detected light signal is also supplied to the converter 9 via the optical fiber C2 and is converted into the electric signal. Then, these electric signals are supplied to the calculating circuit 10 and the calculating circuit calculates the absolute values of the current and voltage and the phase difference therebetween. In accordance with the absolute values of the current and voltage and the phase difference, the judging circuit 11 judges the direction into which the ground fault current has passed, and the thus judged direction is displayed on the display device 12 in the fault detecting apparatus 13.

The light signals transmitted to the watching device 14 are supplied to the distance calculating circuit 18 by means of the transmission and reception circuit 15 and O/E converter 17. In response to the signals, the distance calculating circuit 18 sends commands to the sensors 21 and 22 to detect the fault current and voltage, respectively at the sub-station H. Then, the distance calculating circuit 18 calculates the absolute values of the fault current and voltage and the phase difference, and further calculates the distance from the sub-station H to the fault point F. It should be noted that the calculating circuit 18 can also judge a transmission circuit on which the fault has occurred.

When the point of the fault has been detected by the watching device 14, an operator in the sub-station H reports the occurrence of the fault to a monitoring station which situates nearest to the detected fault point. Then, an operator in the monitoring station attends to the power transmission tower at which the fault has detected. At the power transmission tower, the operator can confirm the fault and can know the direction of the fault current by watching the display device 12 in the fault detecting apparatus 13.

As explained above, according to the invention, the direction of the fault current can be detected accurately and easily even if the transmission line is divided into a number of branches. Furthermore, the distance from the branch to the point at which the fault has occurred can be calculated positively. Further, the watching device 14 in the sub-station H can monitor or manage a plurality of the fault detecting apparatuses in a central control manner. Therefore, the time required for finding the fault point can be reduced materially and the labor work of the operators can be saved to a large extent.

Moreover, in the present embodiment, the correction circuit 18a is provided in the distance calculating circuit 18 of the watching device 14, and the calculated result supplied from the fault detecting apparatus 13 in case of the short-circuit fault is compared with the calculated result obtained by the distance calculating circuit 18 in the watching device 14 and the normal current components are compensated for. Therefore, the distance can be detected very accurately. This fault detection is operable even under the multiple-ground faults and multiple short-circuit fault, in that the fault point can be located precisely.

Figures 8A, 8B:
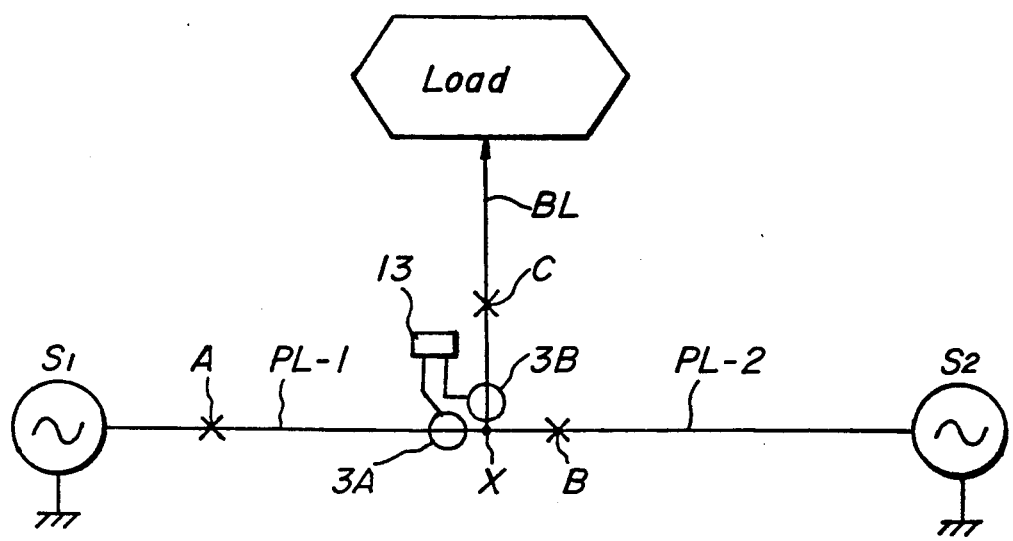
FIGS. 8A and 8B explain the manner of judging the fault point in the double-sided power transmission system including the branch.

In the present embodiment, since the direction of the fault current is judged, even if the sub-stations are arranged on both ends of the transmission line as shown in FIG. 8A, it is possible to locate the fault point. In this case, the judgment of the current direction may be effected by the watching device 14 in accordance with the detection signal supplied from the fault detecting apparatus 13 or by the fault detecting apparatus 13 itself. In the latter case, the judged result is transmitted to the watching device 14. Further, in the latter case, the judged direction of the fault current may be displayed on the display device 12 in the fault detecting apparatus 13, so that the operator can find the direction of the fault easily by watching the display device 12.

Moreover, since the fault detecting apparatuses 13 are arranged at respective branch points $B_1$, $B_2$, $B_3$ ..., the current and voltage can be detected accurately without being influenced by the external noise as well as the conditions of other power transmission sections, and therefore the absolute values of the current and voltage and the phase difference between the current and voltage can be calculated precisely.

In the embodiment so far explained, the current detection is carried out by means of the opto-magnetic element, but the current may be detected by the current transformer including the iron core. Similarly, the voltage may be detected by utilizing the voltage division technique with the aid of the capacitor instead of the opto-electric field element. Further, the information signal may be transmitted to the watching device 14 by the space transmission with the aid of laser light, ultrasonic wave and magnetic wave instead of the optical fiber transmission. Moreover, the fault detecting apparatus 13 provided at the power transmission branch tower may comprise the circuit for calculating the distance from the relevant branch to the fault point. Then, the calculated distance may be transmitted to the watching device 14.

In the above embodiment, there is provided the watching device 14 at the sub-station H, but according to the invention, the watching device 14 may be omitted. In such a case, the calculating circuit 10 arranged in each of the fault detecting apparatuses 13 provided at respective transmission towers may calculate the distance from the relevant transmission tower to the fault point and the thus calculated distance is displayed on the display device 12. In this case, when the fault has occurred at the point F on the transmission line as illustrated in FIG. 4, the opto-magnetic element 3 detects the fault current and then the calculating circuit 10 calculates the distance from the relevant branch point B to the fault point F in accordance with the following equations.

$e_A$: voltage at the branch B $|E_A|$: absolute value of the voltage at the branch B Then, the fault current $i_f$ may be represented by the following equation.

$$i_f = e_A/(R \cdot l + r_f + r_E + jX \cdot l) \tag{6}$$

From the equation (1), there may be derived the following equation.

$$|E_A|^2/|I_f|^2 = (R \cdot l + r_f + r_E) + X^2 l^2 \tag{7}$$

The phase difference $\phi$ between the fault current and the branch voltage may be expressed by the following equation (8).

$$\tan \phi = X l/(R \cdot l + r_f + r_E) \tag{8}$$

Then, from the above equations, the following equation (9) may be obtained.

$$r_f + r_E = X \cdot l/\tan \phi - R \cdot l \tag{9}$$

From the equations (7) and (9), the distance l from branch point B to the fault point F may be calculated from the following equation.

$$l = (|E_A|/|I_f|X) \times \sqrt{\tan \phi/(1 + \tan \phi)} \tag{10}$$

In the above equation (10), the absolute value of the branch voltage $|E_A|$, absolute value of the fault current $|I_f|$ and the phase difference $\phi$ can be obtained from the calculation results of the calculation circuit 13, and the impedance X has been previously determined for respective transmission sections and may be treated as a constant.

In the manner explained above, the fault detecting apparatus 13 calculates the distance l from the branch point B to the fault point F when the fault occurs within its territory. Further, the direction of the fault is displayed on the display devices 12 provided in the fault detecting apparatuses 13, so that the operator can easily find a fault detecting apparatus in the territory in which the fault has occurred. Then, by reading the distance from the relevant fault detecting apparatus to the fault point calculated by the calculating circuit provided in the relevant apparatus, the fault point F can be detected promptly and easily. In the present embodiment, since it is not necessary to provide the watching device 14, the cost of the whole system can be reduced.

Figure 5:
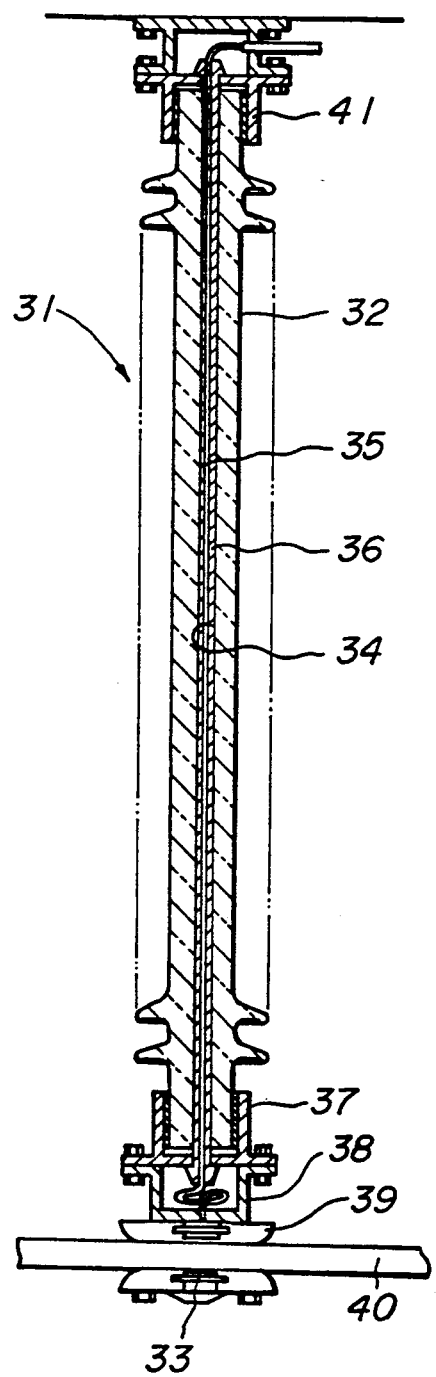
FIG. 5 is a cross sectional view showing a first embodiment of the optical current sensor according to the invention.

FIG. 5 is a cross sectional view showing an embodiment of the optical current sensor having the insulator and the opto-magnetic element. As illustrated in FIG. 5, the optical current sensor 31 comprises an insulator 32 having a central hole 34 formed therein, and an optical fiber 35 inserted in the central hole. A firing agent 36 such as silicon resin is filled within the space between the optical fiber 35 and the inner wall of the central hole 34. To the lower end of the insulator 32 an iron core 39 is secured by means of lower fitting member 37 and lower joint box 38. Within the iron core 39 there is provided an opto-magnetic element 33 formed by the Faraday's element such as YIG and BSO. A conductor 40 of the power transmission line is supported by the iron core 39. The optical fiber 35 is extended outwardly through an upper joint box 41. The polarization plane of the laser light transmitted through the optical fiber 35 is rotated or modulated in accordance with the magnetic field induced in the iron core 39 due to the current flowing through the conductor 40.

Figure 6:
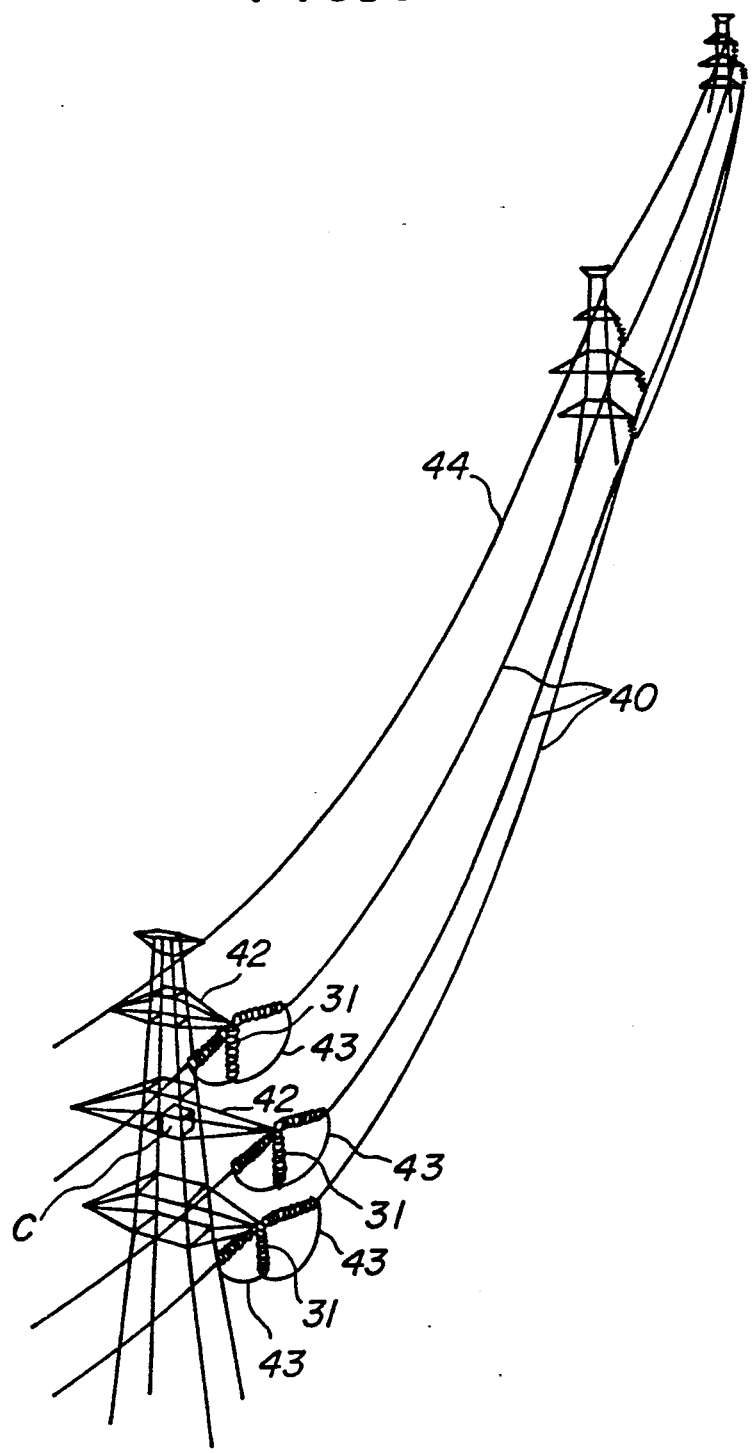
FIG. 6 is a perspective view illustrating the power transmission system including the optical current sensor shown in FIG. 5.

As shown in FIG. 6, the optical current sensors 31 are arranged between the conductors 40 of respective phases and a tower 42. It is advantageous that jumper lines 43 are provided between the conductor 40 and the insulators 32, but the jumper lines may be omitted.

On the tower 42 there is arranged the circuit portion C of the fault detecting apparatus 13 which is connected to the current sensors 31 by means of the optical fibers 35 in such a manner that the light beam generated by the E/0 converter is transmitted to the opto-magnetic element 33 by means of the optical fiber and the modulated light beam is made incident upon the O/E converter through the optical fiber. The optical fiber 35 is so arranged that the light beam passes through the opto-magnetic elements 35 of respective phases in succession. That is to say, the opto-magnetic elements 35 are optically arranged in series with each other. Therefore, the light beam being made incident upon the O/E converter has been modulated by the zero-phase current. When there is no fault on the transmission line, there is no zero-phase current, so that the signal supplied to the O/E converter becomes zero. When the fault such as the ground fault occurs, the zero-phase current flows and the signal supplied to the O/E converter is not zero. When the judging circuit judges that the fault has occurred, this is displayed on the display device which is arranged at such a position that the operator can easily monitor it. Further, the information about the thus judged fault point is transmitted to the watching device 14 via the over-head optical fiber cable 44. It should be noted that the fault detecting apparatus 13 is energized by a battery which is recharged by a solar cell.

As explained above, in the present embodiment, the change in the currents flowing through the three phase conductors 40 of the power transmission line is directly detected by the opto-magnetic sensors 31 provided between the conductors 40 and the tower 42, so that the fault can be detected with very high precision. Further, a tower around which the fault has occurred is denoted on the display device and thus the fault point can be found easily and promptly.

At the branch tower, it is rather difficult to detect the fault point by providing the fault detecting apparatus 45 only on a single transmission line. In a preferred embodiment of the fault detecting apparatus according to the invention, at the branch point, the fault detecting apparatuses are provided on at least two power transmission lines, and the fault direction judging circuit is provided in the fault detecting apparatus.

Figures 7A, 7B:
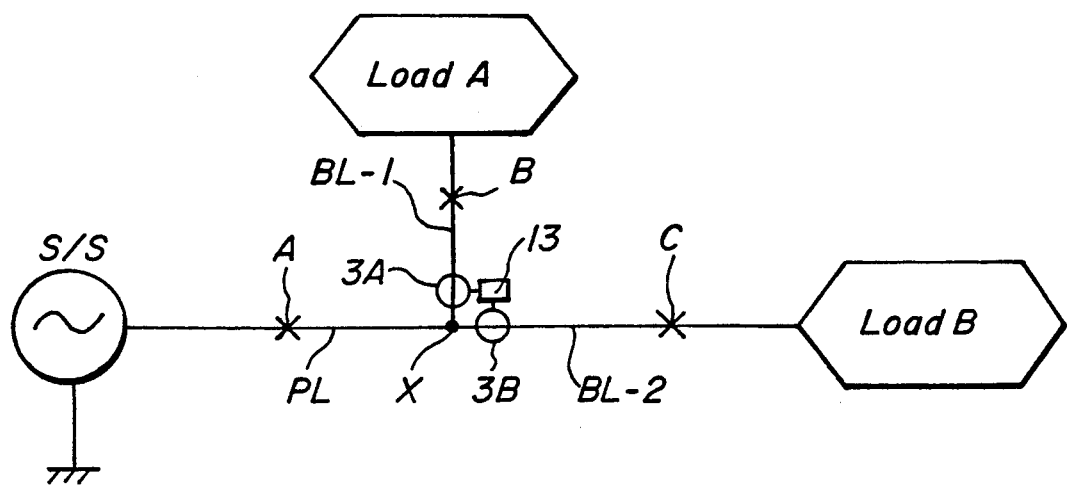
FIGS. 7A and 7B represent the manner of judging the fault point in the single-sided power transmission system including the branch.

FIG. 7A is a circuit diagram showing the arrangement of the optical current sensors in the power transmission system including the branch. A first optical current sensor 3A is arranged on a first branch line BL-1 to which a load A is connected and a second optical current sensor 3B is provided on a second branch line Bl-2 with which a second load B is coupled. A fault point A is on the power supply side line PL to which a power supply source S/S is connected, a fault point B is on the first branch line BL-1, and a fault point C is on the second branch line BL-2. FIG. 7B shows the result of the judgment. That is to say, when the current sensors 3A and 3B do not detect the fault current, but the fault current is detected at the substation, it can be judged that the fault has occurred at the point A on the power supply side line PL with respect to the branch point X, and when only the first current sensor 3A detects the fault, it is judged that the fault has occurred at the point B on the first branch line BL-1. When the second current sensor 3B detects the fault current, it can be judged that the fault occurs at the point C on the second branch line BL-2. The thus judged result is displayed on the display device in the fault detecting apparatus 13 and the operator can find a tower toward which the operator has to go.

FIG. 8A shows the manner of arranging the optical current sensors in the power transmission system having the branch. In this system, the load is energized by two power supply sources $S_1$ and $S_2$. In this case, a first optical current sensor 3A is arranged on a first power supply side line PL-1 connected to the first supply source S1 and a second optical current sensor 3B is arranged on a second power supply side line PL-2 to which the second power supply source $S_2$ is connected, these current sensors being connected to the fault detecting apparatus 13. The load is connected to a branch line BL. FIG. 8B shows a table for explaining the algorism for judging the direction of fault point. When a fault occurs on the first power supply side line PL-1 such as a point A situating between the first power supply source $S_1$ and the first current detector 3A, the first current sensor 3A detects the fault current flowing in the left-hand direction, but the second current sensor 3B does not detect the fault current. When the fault occurs at a point B on the transmission line PL-2 between the branch point X and the second power supply source $S_2$, the first current sensor 3A detects the fault current flowing in the right hand direction, but the second current sensor 3B does not detect the fault current. When the fault occurs at a point C on the branch line BL situating between the branch point B and the load, both the first and second current sensors 3A and 3B detect the fault currents.

Figure 9:
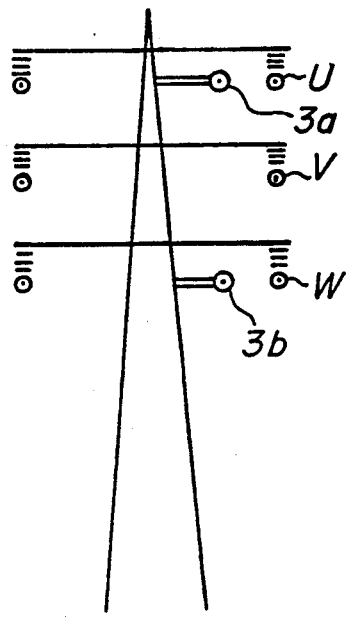
FIGS. 9 and 10 are schematic views showing the arrangement of the optical current sensors with respect to the three-phase conductors.
Figure 10:
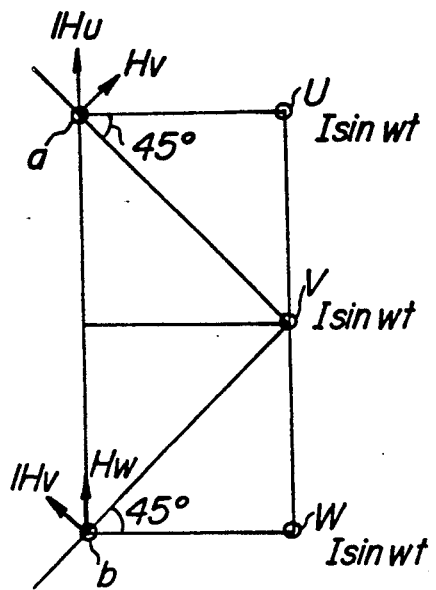

In the embodiments so far explained, the current sensors are provided on each phase conductors, but according to the invention it is not always necessary to take such an arrangement of the current sensors. FIG. 9 is a schematic front view of the tower on which three conductors for three phases U, V and W of the electric power are arranged along the vertical direction and two current sensors 3a and 3b are arranged such that the combination of three magnetic fields induced by the currents passing through the conductors becomes zero. That is to say, as shown in FIG. 10, the current sensors 3a and 3b are arranged at positions a and b, respectively, said points a and b being determined as cross points between horizontal lines passing through the upper and lower conductors U and W and inclined lines which pass through the middle conductor V and make an angle of 45 degrees with respect to the above mentioned horizontal lines, respectively. Then, magnetic fields applied to the points a and b due to the currents passing through the three conductors U, V and W may be represented by the following equations.

magnetic field at point a due to upper conductor:

$$H \sin \omega t \tag{11}$$

vertical component of magnetic field at point a due to middle conductor:

$$(H/\sqrt{2}) \sin(\omega t - \tfrac{2}{3}\pi)\cdot \cos \pi/4 \tag{12}$$

vertical component of magnetic field at point b due to middle conductor:

$$(H/\sqrt{2})\sin(\omega t - \tfrac{1}{4}\pi)\cdot\cos \pi/4 \qquad (13)$$

magnetic field at point b due to lower conductor:

$$H\sin(\omega t + \tfrac{1}{4}\pi) \qquad (14)$$

Therefore, the combination of magnetic fields detected by the two opto-magnetic sensors becomes zero. Therefore, when there is not occurred any fault, the zero-phase current is detected as a value of zero, but when the ground fault occurs, the zero-phase current is detected in accordance with the impedance of the power transmission line and the ground impedance. In the present embodiment, since the current sensor is not directly secured to the conductor, it is not necessary to use the expensive and reliable current sensor, so that the current sensor may be less expensive. Further, the current sensor may be arranged or replaced without interrupting the power supply through the conductors. Moreover, since it is sufficient to provide only two current sensors for each power transmission line having three phase conductors, the construction of the fault detecting apparatus can be simple and small.

Now several embodiments of the optical current sensor having the insulator, optical fiber and opto-magnetic element will be explained.

Figure 11:
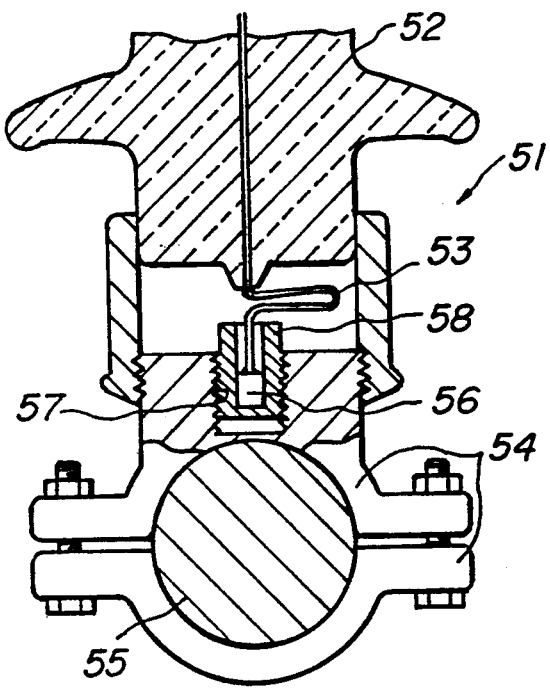
FIG. 11 is a cross sectional view showing a second embodiment of the optical current sensor according to the invention.

FIG. 11 is a cross sectional view showing the lower end of the optical current sensor according to the invention. In the present embodiment, a current sensor 51 comprises an insulator 52 having an optical fiber 53 installed therein. To the lower end of the insulator 52 is connected a conductor clamp 54 for clamping a conductor 55. Within the clamp 54 is arranged an opto-magnetic element 56 such as Faraday's element. The polarization direction of a light beam passing through the element 56 is modulated by the magnetic field induced by the current flowing through the conductor 55. The conductor lamp 54 is made of non-magnetic material such as aluminum and has formed therein a central hole 57 with a female screw thread. The opto-magnetic element 56 is secured in a fitting member 58 having a male screw thread which is engaged with the female screw thread of the central hole. As shown in FIG. 12, the strength of the magnetic field is varied remarkably in accordance with the distance from the center of the conductor 55 to the element 56. Therefore, by rotating the fitting member 58 within the central hole 57 it is possible to adjust the strength of the magnetic field applied to the opto-magnetic element 56 in an easy and accurate manner. In this manner the sensitivity of the optical current sensor can be adjusted. It should be noted that there is provided a suitable mechanism which insures that the posture of the opto-magnetic element 56 with respect to the direction of the magnetic field is not changed by the rotation of the fitting member 58. The opto-magnetic elements are optically coupled with each other in series by means of the optical fiber, and the polarizing plane of the light is rotated by the magnetic fields induced by the three phase currents successively, so that the zero-phase current is detected.

FIG. 13 is a perspective view showing another embodiment of the optical current sensor having the mechanism for adjusting the detection sensitivity. To the lower end of the insulator (not shown in FIG. 13) is secured an iron core 61 and an opto-magnetic element 62 is provided in a gap formed in the core. That is to say, the element 62 is secured to a cylindrical fitting member 63 having male screw thread formed on an outer surface thereof, and the fitting member is rotatably fitted into a hole formed in a rectangular fitting block 64 made of magnetic material. In a side wall of the hole there is formed a female screw thread which is engaged with the male screw thread of the fitting member 63. The fitting block 64 is clamped into the gap formed in the iron core 62. By rotating the fitting member 63 within the fitting block 64, the direction of the opto-magnetic element 62 with respect to the direction of the magnetic field induced in the core 61 due to the current passing through the conductor can be adjusted. The strength $H_s$ of the magnetic field applied to the opto-magnetic element 63 may be represented by the following equation.

$$H_s = H_g \cos\theta \qquad (15)$$

wherein $H_g$ denotes the strength of magnetic field existent in the gap of the core 61, and $\theta$ represents the angle of the principal axis of the element with respect to the magnetic field. Therefore, by changing the angle $\theta$ it is possible to adjust the magnitude of the magnetic field applied to the opto-magnetic element 62.

FIG. 14 is a perspective view illustrating still another embodiment of the optical current sensor having the sensitivity adjusting faculty. In this embodiment, a magnetic core 71 has a tapered gap and a fitting block 72 made of non-magnetic material and having the tapered outside configuration corresponding to the tapered gap is inserted into the gap. An opto-magnetic element 37 is arranged in a recess formed in the fitting block 72 such that the element can be moved in the axial direction of the core 71. Now it is assumed that the core 71 has a circumferential length of $l_1$ and the permeability of $\mu$, and the amplitude of the current passing through the conductor is expressed by I. Then, the strength of the magnetic field $H_g$ within the gap having the length of $l_2$ can be represented by the following equation.

$$H_g = 4\pi \times 10^{-3} \times \mu \times I/l_1(1 + l_2 \times /l_1) \qquad (16)$$

Therefore, by shifting the opto-magnetic element 73 within the recess of the fitting block 72 so that the element is situated at a position having a desired gap length $l_2$, it is possible to adjust the strength of the magnetic field applied to the element.

FIGS. 15 and 16 show still another embodiment of the optical current sensor having the sensitivity adjusting mechanism. In the present embodiment, a magnetic core 81 has two gaps and an opto-magnetic element 82 is fixed in a first gap. In a second gap of the core 81, a magnetic member 83 is inserted such that the member 83 can be shifted in the radial direction of the core 81. As best shown in FIG. 16, the side walls of the gap have the comb-like structure and the side walls of the fitting member 83 have the corresponding comb-like structure, so that the fitting member can be shifted within the gap without play and a leakage of the magnetic flux at the contacts between the core and the fitting member can be suppressed effectively. When the fitting member 83 is made of magnetic material having the same permeability as the magnetic core 81, the change of the magnetic field applied to the opto-magnetic element 82 becomes proportional to a length of a part of the fitting member which is not existent within the gap. Further, the magnetic member 83 may be made of magnetic material having such a permeability that the strength of the magnetic flux applied to the element 82 becomes equal to a desired value when the magnetic member 83 is fully inserted into the gap of the core 81. In such a case, the treatment of the magnetic member 83 becomes simple and the whole construction of the magnetic core becomes compact.

FIG. 17 is a cross sectional view showing an embodiment of the optical current sensor having the insulator for supporting the conductor through which the current to be sensed flows. The current sensor comprises an insulator 101, a metal fitting 102 provided at the top end of the insulator, and a conductor clamping member 103 provided at the lower end of the insulator. The insulator 101 has a central hole 104 formed therein, and an optical fiber 105 is inserted into the central hole 104, while a space between the optical fiber and the inner wall of the hole is filled with fitting agent 106 such as silicon resin. In order to avoid undesired deformation of the fitting agent 106 due to the temperature variation, the upper and lower ends of the central hole 104 are tapered and the fitting agent is protruded from the central hole at the upper and lower ends into the frustoconical shape.

The conductor clamping member 103 has a recess 108 formed in a surface which is faced to the lower end of the insulator 101. The conductor clamping member 103 further includes a clamper 110 for clamping a conductor 109. A flange portion 103a of the conductor clamping member 103 is secured to the lower end of the insulator 101 by means of fitting member 111 fixed to the insulator, and O-rings 111a are inserted between the conductor clamping member 103 and the insulator 101 and fitting member 111.

An opto-magnetic element 113 for detecting the current passing through the conductor 109 is arranged between the conductor clamping member 103 and the lower end face of the insulator 101. The opto-magnetic element 113 may be formed by the Faraday's element such as YIG and BSO which can convert the current into the light signal. The Faraday's element can detect the current by utilizing the rotation of the polarization plane due to the magnetic field generated by the current passing through the conductor 109. In the present embodiment, the opto-magnetic element 113 is embedded in the lower protruded portion of the fitting agent 106. Further the lower end of protruded portion of the fitting agent 103 is brought into contact with the upper surface of the recess 108 formed in the conductor clamping member 103, so that the opto-magnetic element 113 is effectively prevented from being moved in the axial direction of the insulator 101 due to the temperature variation. In the present embodiment, the opto-magnetic element 113 is hermetically sealed and the whole construction of the sensor becomes very compact.

At the lower end of the insulator 101 there is further secured a shielding member 114 made of ferromagnetic material. The shielding member 114 surrounds the conductor 109 and extends in parallel with the conductor along a limited length thereof.

The upper end of the insulator is hermetically closed by a box 115 which projects above an insulator holding plate 116 so that the whole length of the insulator can be shortened.

FIG. 18 is a cross sectional view showing still another embodiment of the optical current sensor according to the invention. The present embodiment differs from the embodiment illustrated in FIG. 17 only in a point that an iron core 117 is provided in the conductor clamping member 103 and the opto-magnetic element 113 is provided in a gap formed in the iron core. The remaining construction is the same as that of the embodiment shown in FIG. 17, so that the portions same as those of the embodiment shown in FIG. 17 are denoted by the same reference numerals used in FIG. 17. The iron core 117 serves to concentrate the magnetic flux into the opto-magnetic element 113 as well as to shield the external magnetic field so that the opto-magnetic element 113 is effectively protected against the external magnetic field. As compared with a the previous embodiment, the present embodiment is smaller in size and lighter in weight.

Figure 19:
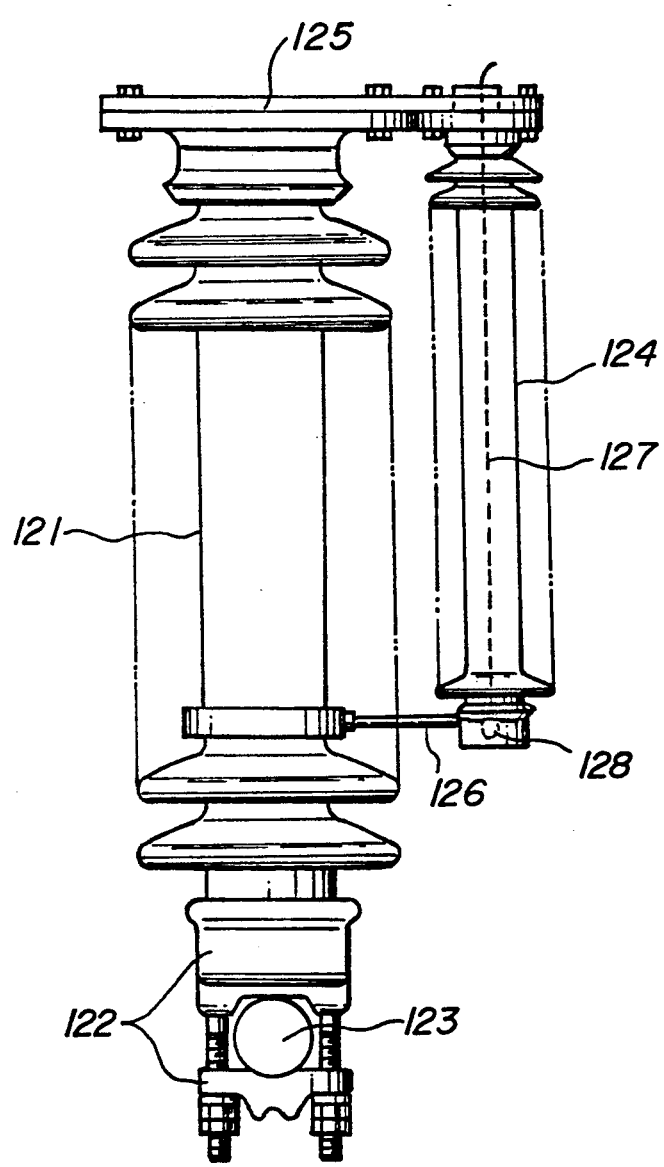
FIG. 19 is a side view showing still another embodiment of the optical current sensor according to the invention.

FIG. 19 shows still another embodiment of the optical current sensor according to the invention. A reference numeral 121 denotes an ordinary long rod type insulator for supporting a conductor 123 which is secured to the insulator by means of a conductor clamping member 122. In the present embodiment, an optical current sensing insulator 124 is provided along the conductor supporting insulator 121 in parallel therewith. The upper end of the current sensing insulator 124 is connected to the conductor supporting insulator 121 by means of an insulator securing plate 125 made of metal, and the lower end of the current sensing insulator 124 is coupled with the insulator 121 by means of a fitting rod 126 made of insulating material such as ceramics and FRP. The current sensing insulator 124 has a central hole formed therein and an optical fiber 127 is inserted into the central hole. At the lower end of the optical fiber 127 is arranged an opto-magnetic element 128 formed by the Faraday's element such as YIG and BSO.

Figure 20:
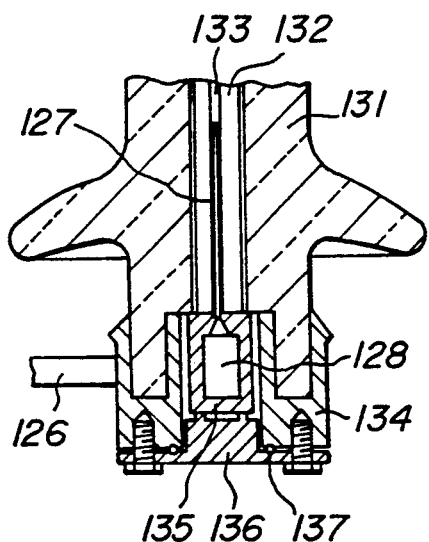
FIG. 20 is a cross sectional view illustrating a part of the sensor shown in FIG. 18.

FIG. 20 illustrates a modification of the current sensing insulator. In order to reduce the weight, size and cost of the optical current sensor, an FRP rod 132 having two longitudinal recesses 133 is inserted into an outer sheath 131 made of organic material such as EP rubber, silicon rubber and epoxy resin. In the longitudinal recesses 133 of the FRP rod 132 are inserted the optical fibers 127, and the opto-magnetic element 128 is provided at the lower end of the optical fibers. At the lower end of the outer sheath 131 is secured a cap 134 made of metal, ceramics and organic insulator (for instance, epoxy resin and FRP) by means of a cementing agent. Within the cap 134 is arranged the opto-magnetic element 128 surrounded by a protection case 135. The protection case 135 is supported by a lid 136, and an O-ring 137 is inserted therebetween. Since the cap 134 is made of insulating material, there is no fear of corona discharge.

In the embodiments shown in FIGS. 19 and 20, there is a predetermined distance between the opto-magnetic element 128 and the conductor 123. If said distance varies, the strength of the magnetic field applied to the element is changed, but according to the above mentioned construction, said distance is remained constant, so that the current can be measured without an error.

According to the invention, the distance between the optical current sensor 128 and the conductor 123 may be kept constant by any means. For instance, in case of using the vertical supporting type insulator array, a box made of insulating material and holding the opto-magnetic element may be supported by a cap metal member of an insulator situated on the ground side. In this case, since the insulator array swings by the same angle as the conductor, the positional relation between the conductor and the opto-magnetic element remains constant.

In the embodiments in which the optical current sensing insulator is arranged beside the conductor supporting insulator as shown in FIG. 19, the conductor is supported by the usual insulator in the electrically insulating manner, so that the voltage is not applied to the current sensing insulator. Therefore, the current sensing insulator is not deteriorated by the voltage application. Moreover, even if the current sensing insulator is deteriorated, there is not generated any flash-over. In this manner, high-reliability can be attained to the same extent as that obtained by the usual insulator. Further, since the existent conductor supporting insulator may be utilized as it is, any extra space is not required to provide the current sensing insulator. It should be further noted that the condition of the current passing through the conductor is detected as the light signal, so that the signal is not affected by noise due to the external magnetic and electric fields.

Figure 21:
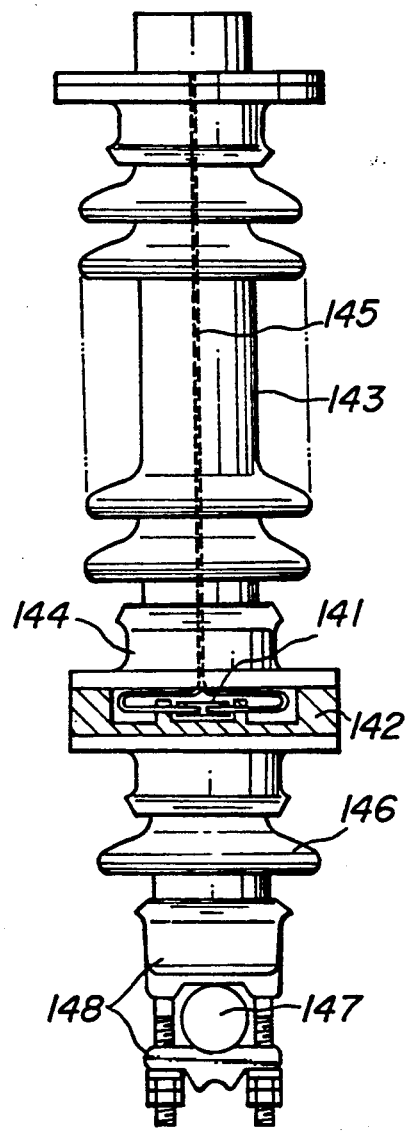
FIG. 21 is a partially cross sectional view showing still another embodiment of the optical current sensor according to the invention.

FIG. 21 illustrates still another embodiment of the optical current sensor according to the invention. In this embodiment, an opto-magnetic element 141 is installed in a box 142 made of insulating material such as ceramics and insulating organic material (for instance, epoxy resin and FRP). The box 142 is secured to a lower end of current sensing insulator 143 by means of a fitting member 144. Optical fibers 145 are inserted into a central hole formed in the insulator 144 and the lower ends of the optical fibers are coupled with the opto-magnetic element 141, loops of the optical fibers being formed within the box 142, so that any excessive force is not applied to the junction points between the fibers and the element. To the lower surface of the box 142 is secured a solid insulator 146, and a conductor 147 is supported to the lower end of the solid insulator by means of a conductor clamping member 148. It should be noted that the peripheral length of the solid insulator 146 has to be set to such a value that even if the current sensing insulator 143 becomes completely conductive, any internal flash over does not occur.

FIGS. 22 and 23 show still another embodiment of the optical current sensor according to the invention. In the present embodiment, portions similar to those illustrated in FIG. 21 are denoted by the same reference numerals used in FIG. 21. In the upper end face of the solid insulator 146 for supporting the conductor 147, there is formed a recess 146a and the opto-magnetic element 141 is arranged in this recess by means of a fixing base 149 made of insulating material. The current sensing insulator 143 and the solid insulator 146 are connected to each other by means of an adhesive agent such as epoxy resin.

Figures 24, 25:
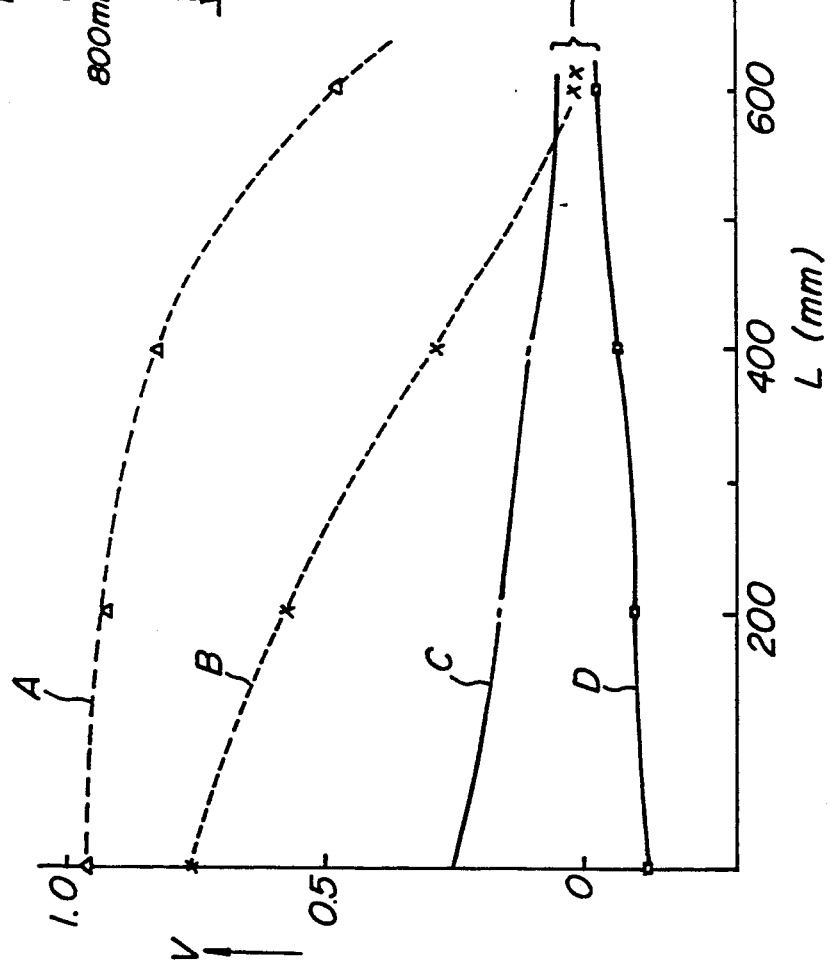
FIG. 24 is a graph representing the variation of the magnetic field induced by the current passing through the conductor.
FIG. 25 is a schematic view for explaining the positional relation between the sensor and the conductor.

In the power transmission system using three-phase conductors arranged vertically, the opto-magnetic element for the middle conductor is influenced by magnetic fields generated by currents passing through the upper and lower conductors to a larger extent. Therefore, it is desirable to provide the opto-magnetic element near the conductor as close as possible as can be understood from the graphs shown in FIG. 24. In FIG. 24, the horizontal axis represents a distance L (mm) from the lower end of the tower arm T and the opto-magnetic element S as illustrated in FIG. 25. The left-hand vertical axis denotes a variation V of the magnetic field applied to the opto-magnetic element due to the swinging movement of the conductor C, and the right-hand vertical axis represents a ratio R of the magnetic fields induced by other conductors to that induced by the relevant conductor. Curves A and B represent the variation of the magnetic field in the conditions that the conductor C is swung by the angles $\theta$ of 15° and 40°, respectively, as illustrated in FIG. 25. Curves C and D denote the ratios R of the magnetic fields induced by the upper and lower conductors, respectively to the magnetic field induced by the middle conductor in such a condition that $\theta$ equals zero. When the conductor is not fixed and is liable to be swung due to the wind, the magnetic field might be varied to a great extent. However, in the embodiments of the current sensing insulator according to the present invention in which the opto-magnetic element is arranged stationary with respect to the conductor, the magnetic field applied to the element is not varied, while the influence of the magnetic fields induced by the currents passing through the upper and lower conductors exist.

FIG. 26 illustrates still another embodiment of the optical current sensor according to the invention. In the present embodiment, a current sensing insulator 151 is secured at its upper end to a supporting member 152 by means of fixing member 153, and a conductor 154 is supported by means of an insulator not shown separately from the current sensing insulator 151. An opto-magnetic element 155 is arranged at the lower end of the insulator 151 and is optically coupled with optical fibers 156 inserted in a central hole formed in the insulator. In order to prevent the inside flash over, the central hole is filled with an insulating filling agent 157 such as silicon resin. At the upper and lower ends of the insulator 151, the filling agent 157 is projected from the central hole into the frustoconical shape, so that the influence of the thermal expansion of the filling agent is mitigated. The opto-magnetic element 155 is formed by the Faraday's element such as YIG and BSO. In the present embodiment, the element 155 is embedded in the lower protrusion of the filling agent 157. The upper and lower ends of the insulator 151 are hermetically closed by caps 158 and 159, respectively. The output of the opto-magnetic element 155 is derived toward the ground side by means of the optical fiber 156. The lower cap 159 is made of non-magnetic metal, ceramic and resin material. It is desired that the lower cap 159 is made of insulating material, because in such a case there is no fear of corona discharge, even if the opto-magnetic element is arranged closer to the conductor 154. Therefore, the distance between the element 155 and the conductor 154 may be determined at will by considering the sensitivity and the output gain of the element, so that the optimum design may be attained. It should be further noted that the above mentioned air-gap distance has to be determined such that even if the current sensing insulator 151 shows the inside short-circuiting, flash over between the conductor and the current sensing insulator is not generated.

What is claimed is:

1. An apparatus for detecting a fault on an over-head power transmission line supported by power transmission towers comprising:

optical current sensing means including at least one optical current sensor which comprises an opto-magnetic element for detecting a current passing through a power transmission conductor to generate a first optical signal and an insulator for securing said opto-magnetic element to a power transmission tower such that the opto-magnetic element is positioned to sense the magnetic field induced by said current passing through the power transmission conductor supported by said power transmission tower, said insulator having a central hole formed therein, said opto-magnetic element being formed by a Faraday's element which serves to rotate a polarization plane of a light beam transmitted through said element in accordance with the magnetic field induced by the current to be sensed;

optical voltage sensing means including at least one optical voltage sensor which comprises an opto-electric field element for detecting a voltage applied to the power transmission conductor to generate a second optical signal representing the voltage;

first optical signal transmitting means for transmitting said first optical signal generated by said opto-magnetic element and having optical fibers which are inserted into said central hole formed in said insulator and transmit the first optical signal in an electrically insulating manner from conductive portions of the power transmission line and tower;

second optical signal transmitting means for transmitting said second optical signal generated by said opto-magnetic field element in an electrically insulating manner from conductive portions of the power transmission line and tower; and judging means for receiving the first and second optical signals transmitted through said first and second optical signal transmitting means, respectively, and judging the occurrence of a fault on the power transmission line in accordance with the first and second optical signals.

2. The apparatus of claim 1, wherein said judging means comprises a calculating circuit for calculating a distance to a fault point in accordance with a current, a voltage and a phase difference between the current and the voltage contained in the first and second optical signals supplied from said optical current sensing means and said optical voltage sensing means and a known impedance of the power transmission line, and display means for displaying the calculated distance.

3. The apparatus of claim 2, wherein said judging means is arranged at the power transmission tower.

4. The apparatus of claim 2, wherein said judging means further comprises a watching device arranged at a sub-station, said watching device comprising a distance calculating circuit for calculating a distance to the fault point in accordance with a current, a voltage and a phase difference between the current and the voltage contained in the first and second optical signals supplied from said optical current sensing means and said optical voltage sensing means a known impedance of the power transmission line, and display means for displaying the calculated distance.

5. The apparatus of claim 1 for detecting a fault in a power transmission system including a branch, wherein said optical current sensing means comprises at least two optical current sensors each being arranged to sense fault currents passing through at least two power transmission lines at the branch, and said judging means comprises a judging circuit for judging a direction of the fault on the basis of the sensed fault current, and display means for displaying the judged direction of the fault.

6. The apparatus of claim 1, wherein the power transmission line includes three phase conductors, and said optical current sensing means comprises three optical current sensors each of which is arranged to detect current passing through respective phase conductors, and an optical fiber for connecting the opto-magnetic elements of said three optical current sensors in series with each other to detect a zero-phase current condition.

7. The apparatus of claim 6, wherein each optical current sensor further comprises a magnetic core arranged to surround the power transmission conductor and having a gap in which said opto-magnetic element is arranged, and means for adjusting the strength of the magnetic field applied to said opto-magnetic element.

8. The apparatus of claim 6, wherein said power transmission conductor is secured to a lower end of said insulator by means of a fixing member, and said opto-magnetic element is secured to said fixing member such that a distance from said opto-magnetic element to the power transmission conductor is changed to adjust the strength of the magnetic field applied to aid opto-magnetic element.

9. The apparatus of claim 1, wherein said power transmission conductor is supported at the lower end of said insulator by means of a fixing member, said opto-magnetic element is arranged within a recess formed in an upper surface of the fixing member, and the fixing member is surround by a magnetic shielding member.

10. The apparatus of claim 1, wherein said power transmission conductor is secured to a lower end of a solid insulator by means of a fixing member, said solid insulator is secured to the lower end of the insulator of the optical current sensor, and said opto-magnetic element is arranged within a space formed in an upper portion of said solid insulator.

11. The apparatus of claim 1, wherein said power transmission conductor is secured to a lower end of a solid insulator by means of a fixing member, said insulator of the optical current sensor is arranged on the side of the solid insulator in parallel therewith, and said opto-magnetic element is arranged at the lower end of the insulator of the optical current sensor.

* * * * *